United States Patent
Azam et al.

(10) Patent No.: US 12,255,653 B2
(45) Date of Patent: Mar. 18, 2025

(54) METHODS AND DEVICES FOR DIGITAL CLOCK MULTIPLICATION OF A CLOCK TO GENERATE A HIGH FREQUENCY OUTPUT

(71) Applicant: Intel Corporation, Santa Clara, CA (US)

(72) Inventors: Ali Azam, Hillsboro, OR (US); Ashoke Ravi, Portland, OR (US); Benjamin Jann, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 756 days.

(21) Appl. No.: 17/356,564

(22) Filed: Jun. 24, 2021

(65) Prior Publication Data

US 2022/0416770 A1 Dec. 29, 2022

(51) Int. Cl.
*H03K 5/00* (2006.01)
*G06F 7/68* (2006.01)
*H03K 5/02* (2006.01)

(52) U.S. Cl.
CPC ........... *H03K 5/00006* (2013.01); *G06F 7/68* (2013.01); *H03K 5/02* (2013.01); *H03K 2005/00286* (2013.01)

(58) Field of Classification Search
CPC ................ H03K 5/00006; H03K 5/02; H03K 2005/00286; G06F 7/68
USPC ..................................................... 327/116
See application file for complete search history.

(56) References Cited

U.S. PATENT DOCUMENTS

| | | | | |
|---|---|---|---|---|
| 7,084,600 B2* | 8/2006 | Suzuki | ................... | F02B 37/10 318/140 |
| 7,154,237 B2* | 12/2006 | Welchko | ................ | B60L 50/51 318/400.27 |
| 7,808,125 B1* | 10/2010 | Sachdeva | ............... | H02M 7/49 363/55 |
| 8,115,433 B2* | 2/2012 | Welchko | ................ | B60L 50/51 318/400.11 |
| 8,208,274 B2* | 6/2012 | Raju | ................ | H02M 3/33576 363/17 |
| 8,269,434 B2* | 9/2012 | Welchko | ................ | B60L 50/51 318/727 |
| 8,487,568 B2* | 7/2013 | Franke | ................. | H02M 7/493 318/800 |
| 8,787,049 B2* | 7/2014 | Chivite Zabalza | ..... | H02M 7/49 363/71 |
| 9,137,084 B2* | 9/2015 | Degani | .................. | H04L 27/36 |
| 9,484,900 B2* | 11/2016 | Cohen | ....................... | H03L 7/00 |
| 9,912,279 B2* | 3/2018 | Chai | .................. | H02M 7/5387 |
| 10,715,038 B1* | 7/2020 | Lin | ......................... | H03L 7/099 |
| 10,862,439 B2* | 12/2020 | Bechthum | .............. | H03F 3/005 |

(Continued)

*Primary Examiner* — Ryan Jager
(74) *Attorney, Agent, or Firm* — Viering, Jentschura & Partner mbB

(57) ABSTRACT

A digital clock multiplier (DCM) circuit including: a plurality of power amplifier (PA) rows, wherein each PA row comprises a plurality of cascade switched capacitor power amplifiers (SCPA) unit cells configured to: receive a phase shift of a driving clock phase; and one or more processors configured to: disable of one or more of the plurality of cascade SCPA unit cells based on a frequency of the phase shift; generate an output signal for each of the cascade SCPA unit cells; and combine the output signal for each of the cascade SCPA unit cells to generate an PA row output signal.

20 Claims, 13 Drawing Sheets

(56) References Cited

U.S. PATENT DOCUMENTS

| | | | |
|---|---|---|---|
| 2010/0142240 A1* | 6/2010 | Lee | H02M 3/3378 |
| | | | 363/132 |
| 2011/0221195 A1* | 9/2011 | Raju | H02M 7/49 |
| | | | 290/44 |
| 2011/0241746 A1* | 10/2011 | Fu | H03H 11/265 |
| | | | 327/276 |
| 2012/0113695 A1* | 5/2012 | Chivite Zabalza | H02M 7/49 |
| | | | 363/71 |
| 2012/0147639 A1* | 6/2012 | Mao | H02M 1/0043 |
| | | | 363/98 |
| 2016/0336909 A1* | 11/2016 | Walling | H03F 3/217 |
| 2019/0190465 A1* | 6/2019 | Bechthum | H03F 3/3064 |
| 2022/0329248 A1* | 10/2022 | Azam | H03L 7/1978 |
| 2022/0416770 A1* | 12/2022 | Azam | H03K 5/00006 |

* cited by examiner

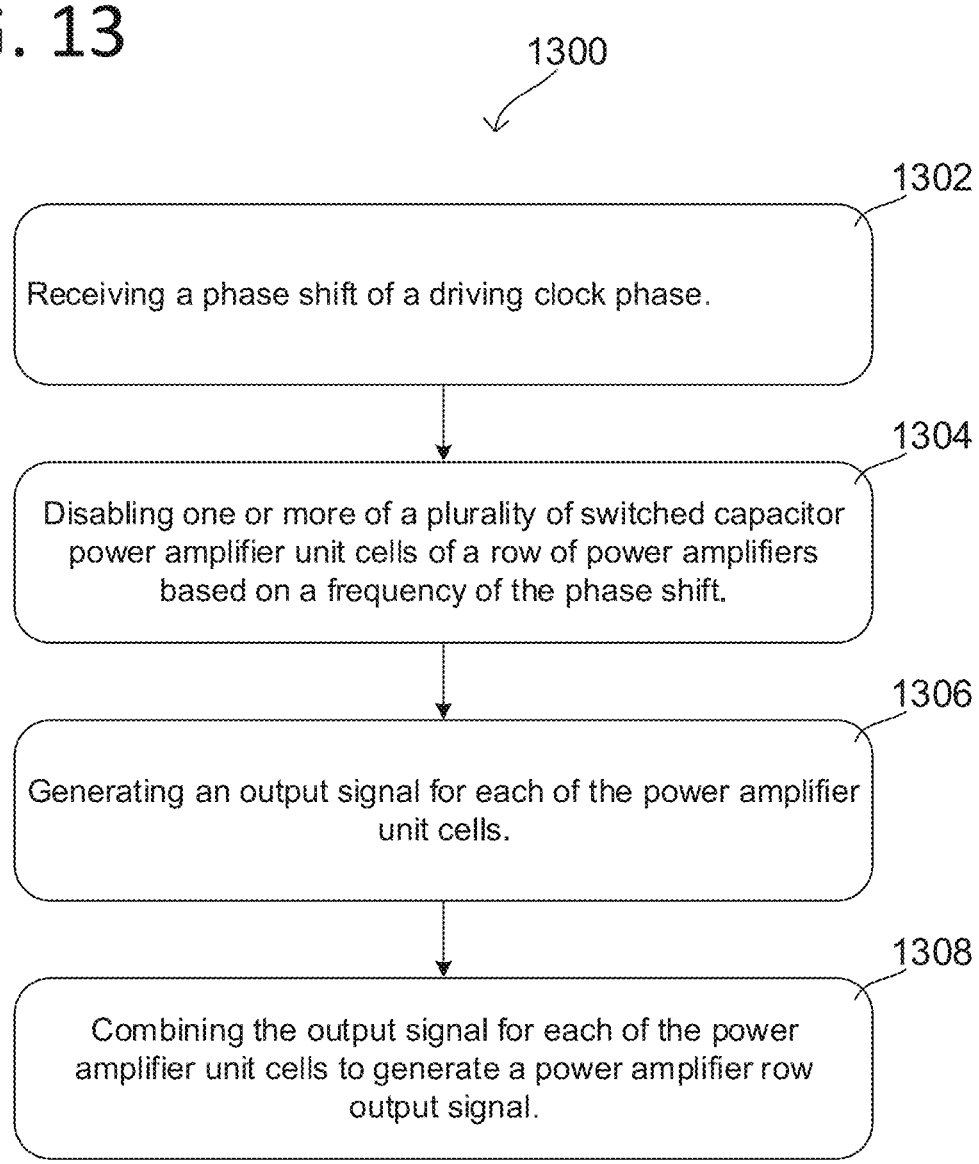

METHODS AND DEVICES FOR DIGITAL CLOCK MULTIPLICATION OF A CLOCK TO GENERATE A HIGH FREQUENCY OUTPUT

TECHNICAL FIELD

Various aspects of the disclosure relate generally to methods and devices for receiving a driving clock and generating a high frequency clock output.

BACKGROUND

In 5G and mmWave transmissions, transceivers require the local oscillator (LO) clock to drive the mixer. The LO clock requires multiplication to generate a desired channel output frequency. To generate the desired output frequency, multiple stages of doublers and/or triplers multiply the LO driving clock from a digital phase locked loop (DPLL). Supporting multiple channel frequencies require multiple DPLLs or the DPLLs must be configured for an extremely wide frequency band. The LO driving clock multiplier may require multiple matching networks, buffers, and polyphaser filters which are power hungry and occupy a large die area. Even with the multiple stages and power-hungry components, the LO multiplier may suffer from low power gain.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 13 shows a method for generating a high frequency output signal.

DESCRIPTION

Figure 1A:
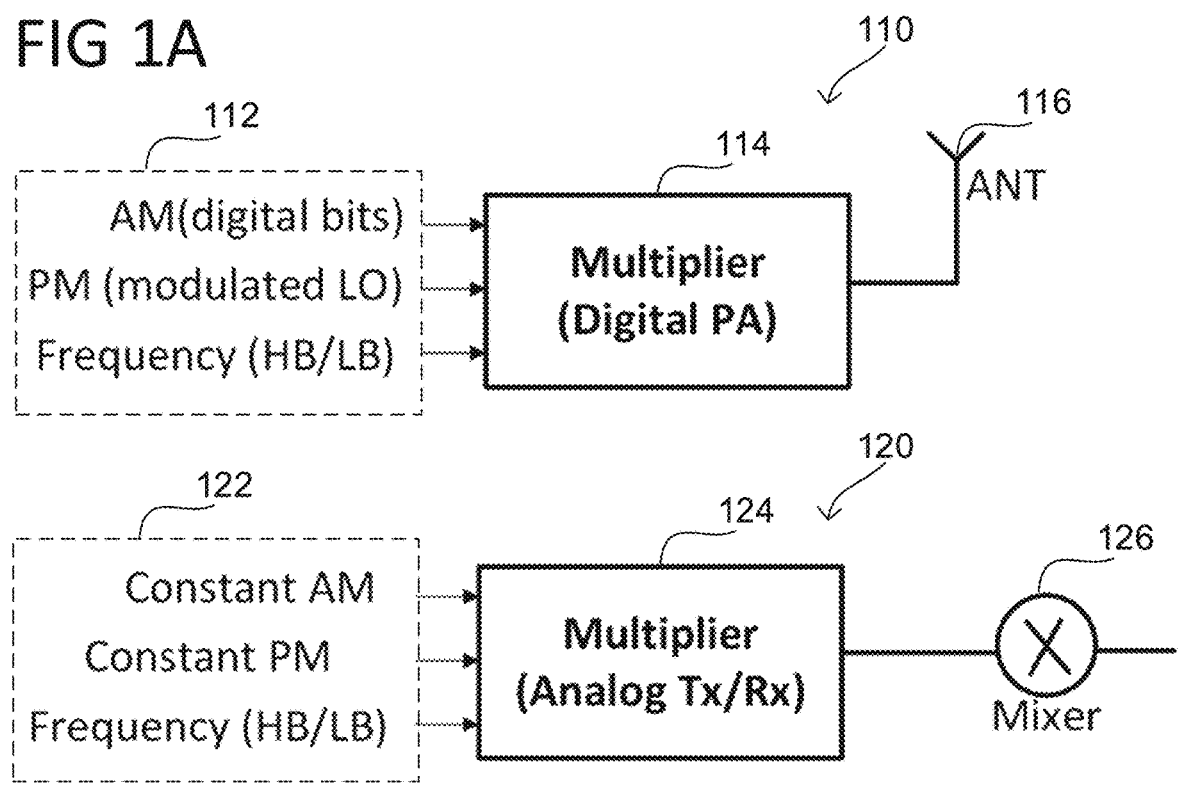
FIGS. 1A and 1B show exemplary high level digital clock multiplier (DCM) configurations

The following detailed description refers to the accompanying drawings that show, by way of illustration, specific details, and aspects of embodiments in which the invention may be practiced.

The word "exemplary" is used herein to mean "serving as an example, instance, or illustration." The words "plurality" and "multiple" in the description and claims refer to a quantity greater than one. The terms "group," "set", "sequence," and the like refer to a quantity equal to or greater than one. Any term expressed in plural form that does not expressly state "plurality" or "multiple" similarly refers to a quantity equal to or greater than one. The term "lesser subset" refers to a subset of a set that contains less than all elements of the set. Any vector and/or matrix notation utilized herein is exemplary in nature and is employed for purposes of explanation. Aspects of this disclosure described with vector and/or matrix notation are not limited to being implemented with vectors and/or matrices and the associated processes and computations may be performed in an equivalent manner with sets or sequences of data or other information.

As used herein, the term "software" refers to any type of executable instruction, including firmware.

Various aspects of this disclosure may utilize or be related to radio communication technologies. While some examples may refer to specific radio communication technologies, the examples provided herein may be similarly applied to various other radio communication technologies, both existing and not yet formulated, particularly in cases where such radio communication technologies share similar features as disclosed regarding the following examples. Various exemplary radio communication technologies that the aspects described herein may utilize include, but are not limited to: a Global System for Mobile Communications (GSM) radio communication technology, a General Packet Radio Service (GPRS) radio communication technology, an Enhanced Data Rates for GSM Evolution (EDGE) radio communication technology, and/or a Third Generation Partnership Project (3GPP) radio communication technology, for example Universal Mobile Telecommunications System (UMTS), Freedom of Multimedia Access (FOMA), 3GPP Long Term Evolution (LTE), 3GPP Long Term Evolution Advanced (LTE Advanced), Code division multiple access 2000 (CDMA2000), Cellular Digital Packet Data (CDPD), Mobitex, Third Generation (3G), Circuit Switched Data (CSD), High-Speed Circuit-Switched Data (HSCSD), Universal Mobile Telecommunications System (Third Generation) (UMTS (3G)), Wideband Code Division Multiple Access (Universal Mobile Telecommunications System) (W-CDMA (UMTS)), High Speed Packet Access (HSPA), High-Speed Downlink Packet Access (HSDPA), High-Speed Uplink Packet Access (HSUPA), High Speed Packet Access Plus (HSPA+), Universal Mobile Telecommunications System-Time-Division Duplex (UMTS-TDD), Time Division-Code Division Multiple Access (TD-CDMA), Time Division-Synchronous Code Division Multiple Access (TD-CDMA), 3rd Generation Partnership Project Release 8 (Pre-4th Generation) (3GPP Rel. 8 (Pre-4G)), 3GPP Rel. 9 (3rd Generation Partnership Project Release 9), 3GPP Rel. 10 (3rd Generation Partnership Project Release 10), 3GPP Rel. 11 (3rd Generation Partnership Project Release 11), 3GPP Rel. 12 (3rd Generation Partnership Project Release 12), 3GPP Rel. 13 (3rd Generation Partnership Project Release 13), 3GPP Rel. 14 (3rd Generation Partnership Project Release 14), 3GPP Rel. 15 (3rd Generation Partnership Project Release 15), 3GPP Rel. 16 (3rd Generation Partnership Project Release 16), 3GPP Rel. 17 (3rd Generation Partnership Project Release 17), 3GPP Rel. 18 (3rd Generation Partnership Project Release 18), 3GPP 5G, 3GPP LTE Extra, LTE-Advanced Pro, LTE Licensed-Assisted Access (LAA), MuLTEfire, UMTS Terrestrial Radio Access (UTRA), Evolved UMTS Terrestrial Radio Access (E-UTRA), Long Term Evolution Advanced (4th Generation) (LTE Advanced (4G)), cdmaOne (2G), Code division multiple access 2000 (Third generation) (CDMA2000 (3G)), Evolution-Data Optimized or Evolution-Data Only (EV-DO), Advanced Mobile Phone System (1st Generation) (AMPS (1G)), Total Access Communication arrangement/Extended Total Access Communication arrangement (TACS/ETACS), Digital AMPS (2nd Generation) (D-AMPS (2G)), Push-to-talk (PTT), Mobile Telephone System (MTS), Improved Mobile Telephone System (WITS), Advanced Mobile Telephone System (AMTS), OLT (Norwegian for Offentlig Landmobil Telefoni, Public Land Mobile Telephony), MTD (Swedish abbreviation for Mobiltelefonisystem D, or Mobile telephony system D), Public Automated Land Mobile (Autotel/PALM), ARP (Finnish for Autoradiopuhelin, "car radio phone"), NMT (Nordic Mobile Telephony), High capacity version of NTT (Nippon Telegraph and Telephone) (Hicap), Cellular Digital Packet Data (CDPD), Mobitex, DataTAC, Integrated Digital Enhanced Network (iDEN), Personal Digital Cellular (PDC), Circuit Switched Data (CSD), Personal Handyphone System (PHS), Wideband Integrated Digital Enhanced Network (WiDEN), iBurst, Unlicensed Mobile Access (UMA), also referred to as also referred to as 3GPP Generic Access Network, or GAN standard), Zigbee, Bluetooth®, Wireless Gigabit Alliance (WiGig) standard, mmWave standards in general (wireless systems operating at 10-300 GHz and above such as WiGig, IEEE 802.11ad, IEEE 802.11ay, etc.), technologies operating above 300 GHz and THz bands, (3GPP/LTE based or IEEE 802.11p and other) Vehicle-to-Vehicle (V2V) and Vehicle-to-X (V2X) and Vehicle-to-Infrastructure (V2I) and Infrastructure-to-Vehicle (I2V) communication technologies, 3GPP cellular V2X, DSRC (Dedicated Short Range Communications) communication arrangements such as Intelligent-Transport-Systems, and other existing, developing, or future radio communication technologies. As used herein, a first radio communication technology may be different from a second radio communication technology if the first and second radio communication technologies are based on different communication standards.

Unless explicitly specified, the term "transmit" encompasses both direct (point-to-point) and indirect transmission (via one or more intermediary points). Similarly, the term "receive" encompasses both direct and indirect reception. Furthermore, the terms "transmit", "receive", "communicate", and other similar terms encompass both physical transmission (e.g., the transmission of radio signals) and logical transmission (e.g., the transmission of digital data over a logical software-level connection). For example, a processor or controller may transmit or receive data over a software-level connection with another processor or controller in the form of radio signals, where the physical transmission and reception is handled by radio-layer components such as RF transceivers and antennas, and the logical transmission and reception over the software-level connection is performed by the processors or controllers.

Several approaches may produce a high frequency output signal. For example, a DPLL may generate a 27 GHz output signal without requiring any multiplication and forward the output signal to a generator block. The generator block may divide the frequency by two and/or include a 25% duty cycle to generate an in-phase and quadrature LO for a frequency mixer. However, a mmWave DPLL design, specifically a digitally controlled oscillator (DCO), has stringent phase noise requirements. Additionally, LO distribution is power consuming and susceptible to layout parasitics. The power consumption can create a bottleneck in performance in a limited power budget environment. Finally, phase-noise may deteriorate performance of a wideband DPLL, therefore requiring multiple DPLLs to support multiple bands of operation.

Alternatively, multi-stage doubler and/or tripler based LO multiplication may generate a high frequency output signal. For example, 2-stage triplers may multiply a 9 GHz LO driving clock to generate an 81 GHz output signal. However, multi-stage doublers or triplers occupy a significant die-area. For instance, a multiplication of 9 for a RADAR application from a 9 GHz LO driving clock requires two cascade triplers. Multi-stage multiplication can include a bulky stage matching network and a long chain of blocks requiring significant power. Furthermore, multi-stage multiplication is not easily reconfigurable. For example, a multiplier of 9 for a specific application would require re-design when the mixer load changes, even if the multiplication factor is kept unchanged. There is little to no power gain with multi-stage multiplication.

Additionally, an injection locked oscillator can generate a desired channel LO frequency. For example, a fifth-harmonic locked oscillator driven by a 9 GHz LO can generate 45 GHz LO. The injection locking technique relies on the LO summation. For example, a multiplication by 3 would require three 120 degree phase shifted LOs. However, a third harmonic generation through summation of three square waves signify ~9.5 dB loss due to combining. Therefore, multiplication beyond 5× is not feasible due to loss. Furthermore, using harmonic locked oscillator means only odd multiplication of 3× and 5× is feasible. Finally, injection locking suffers from low output power delivery capacity and can only be used to drive the mixer.

Methods and devices described below are configured to generate high frequency signals based on a low frequency driving clock. Digital power amplifier (DPA) unit cells may be configured to multiply a low frequency LO input from a PLL and generate a high frequency sinusoidal LO output. A control circuit can generate a desired output frequency by controlling configuration bits of the circuit of unit cells. For example, a circuit of DPA unit cells may be configured as a polar digital power amplifier to deliver high output power, such as ~13 dBm, at high mm-Wave frequencies. Alternatively, the circuit of DPA unit cells can be used as a LO multiplier generating a sinusoidal output to drive active mixers.

Phase offsets can be generated by delay-locked loop (DLL) or digitally controlled edge-interpolator (DCEI). Tri-stating digital unit cells enables the circuit to achieve higher frequency output even it is driven by much lower clock rate. As the overall architecture involves only small number of compact switched-capacitor unit cells, this block can be used locally for generating multiple different LO from one global low frequency LO to support multiple bands of operation.

The proposed LO multiplier is fundamentally a direct up-converting polar digital power amplifier (DPA) with additional frequency configurability. Unlike conventional tripler based LO multiplier or injection locked oscillator based LO multiplication, it has power delivery capacity. Therefore, the circuit can be used as a LO multiplier if used in analog Tx/Rx lineup or can be used as a polar digital PA.

FIG. 1A shows exemplary high-level DCM configurations 110 and 120. Both DCMs are configured to receive three inputs or a 3-way control knob. The inputs, 112 and 122 respectively, include an amplitude modulation (AM), phase modulation (PM), and a frequency. DCM configuration 110 is configured as a polar DPA and may include a DCEI (not shown) to generate phase offsets. DCM 114 multiplies the phase offsets to generate a high output power signal, even at mmWave frequencies. The high output power signal is forwarded to antenna 116 for transmission. DCM configuration 120 is configured as a LO multiplier and may include a DLL (not shown) to generate phase offsets. DCM 124 multiplies the phase offsets to generate a mmWave frequency clock. The high mmWave frequency clock drives mixer 126.

Figure 1B:
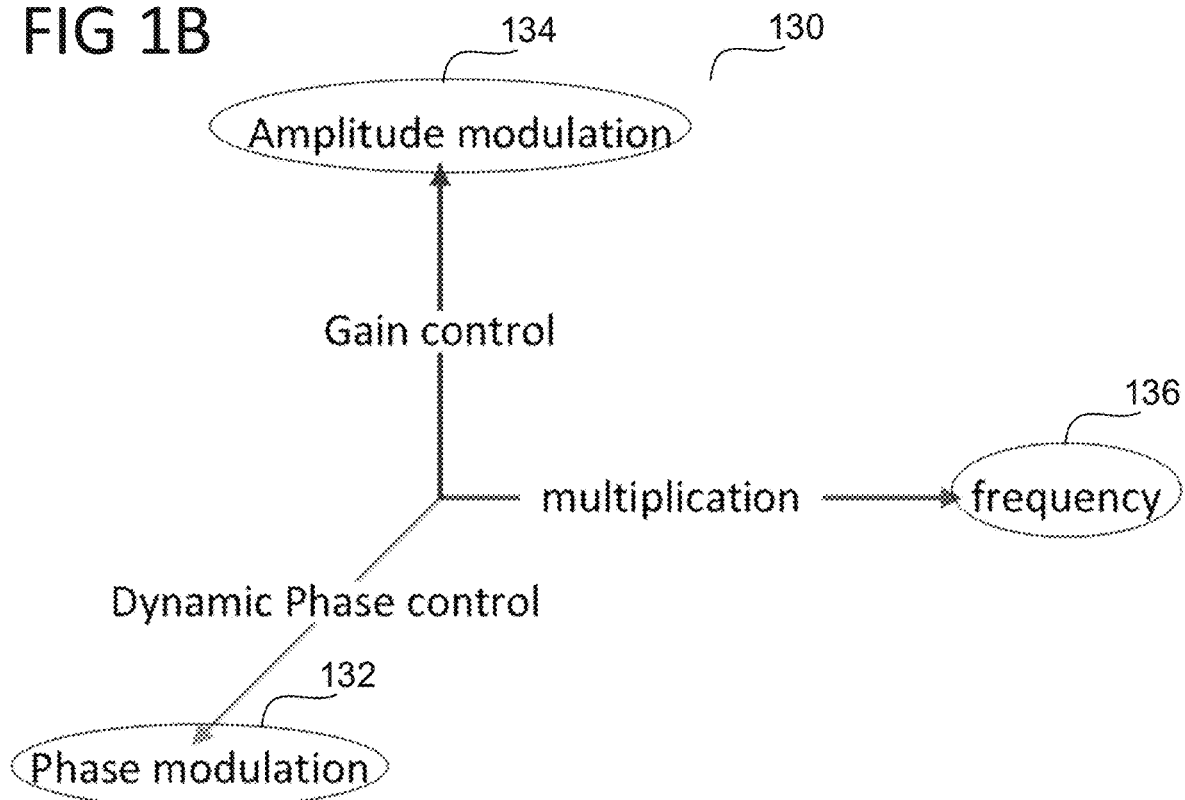

FIG. 1B shows exemplary configurability of configurations 110 and 120. Chart 130 shows how inputs 112 and 122 can affect the DCM output. The three inputs include PM 132, AM 134, and frequency 136, which affect different aspects of the DCM output. PM 132 affects the dynamic phase control of the DCM output. AM 134 affects the power gain of the DCM output. Frequency 136 drives the operating frequency of the DCM output based on the multiplication factor of DCMs 114 and 124. The 3-way control knobs show the flexibility of the DCM configurations in terms of re-usability and configurability. The DCM configuration may function as a DPA or a LO multiplier and generate desired AM/PM/operating frequency outputs with little configuration.

Figure 2:
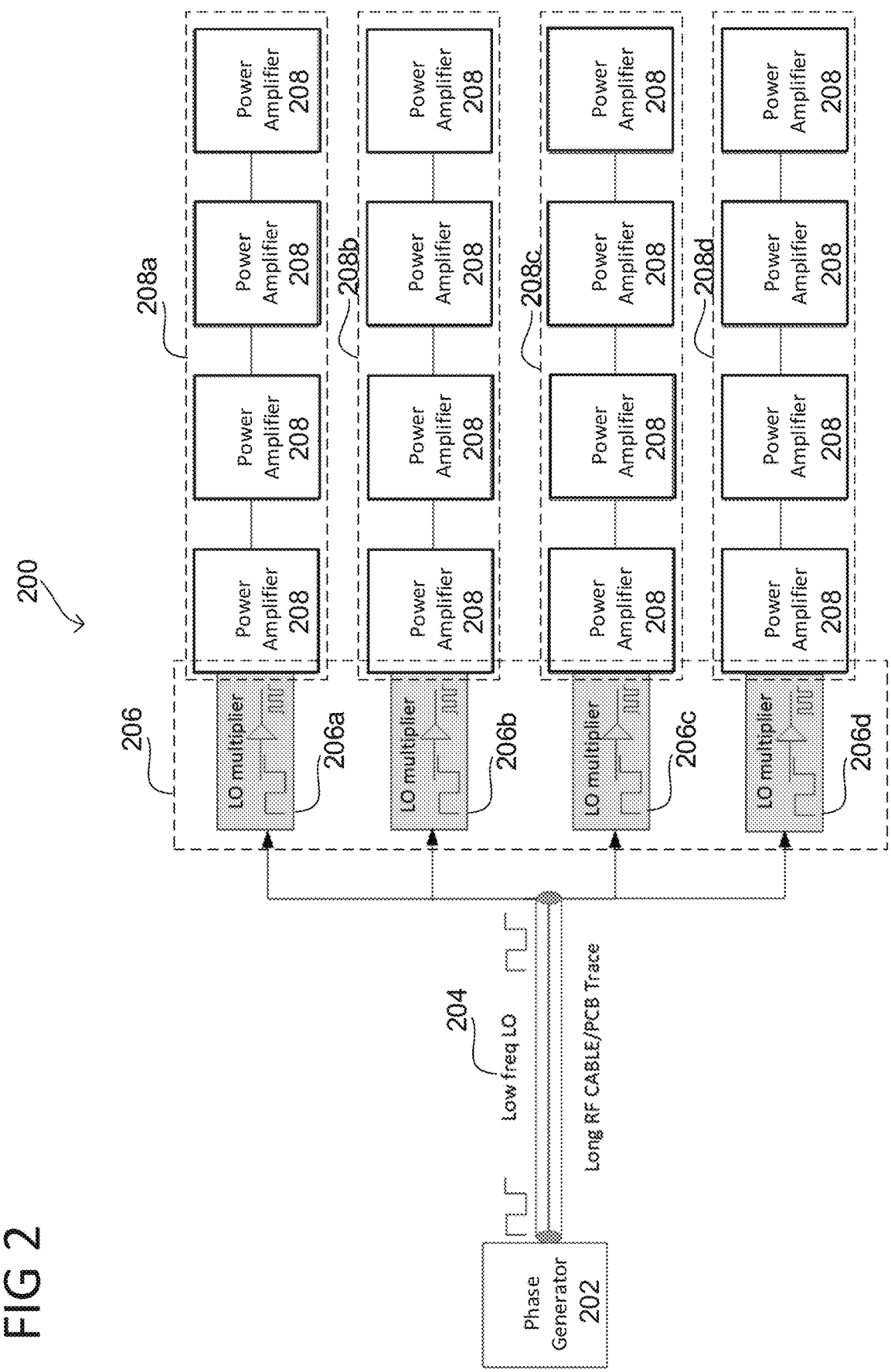
FIG. 2 shows an exemplary low frequency LO multiplication system including a DCM.

FIG. 2 shows a multi-chip system for LO multiplication for small cell/infrastructure to generate mm-Wave signals. Multi-chip system 200 facilitates low frequency LO distribution. System 200 may include phase generator 202 configured to generate low frequency phases 204 of driving clock. Additionally, system 200 may include array 206 of LO multipliers 206a-d configured to generate phases of one of the low frequency phases which phase generator 202 generates. Finally, system 200 may include an array of small unit cell power amplifiers 208, wherein a subset of the PAs may be configured into rows, or cores, 208a-d. The system 200 combines the output of cores 208a-d to form a high frequency signal.

Phase generator 202 may receive an input clock and generate multiple phases of the input clock based on a desired output frequency. Each of the phases may be forwarded to a LO multiplier of array 206. For example, phase generator 202 may generate phase 204 and distribute it to one of the LO multipliers 206a-d. A phase selector (not shown) may distribute the phases.

Array 206 may include multiple LO multipliers 206a-d connected to cores 208a-d, respectively. Each LO multiplier 206a-d is configured to receive a different phase from phase generator 202, for example phase 204, and is coupled to one core. Each LO multiplier generates phases of its received phase and forwards them to the connected core. The PAs 208 of core 208a are controlled based on the phases of LO multiplier 206a. Similarly, other rows of PAs 208b-d are controlled by LO multipliers 206b-d. The cores 208a-d of PAs 208 generate signals at a frequency based on the phases of LO multipliers 206a-d. The generated signals are combined to generate an output signal at the desired frequency.

Figure 3:
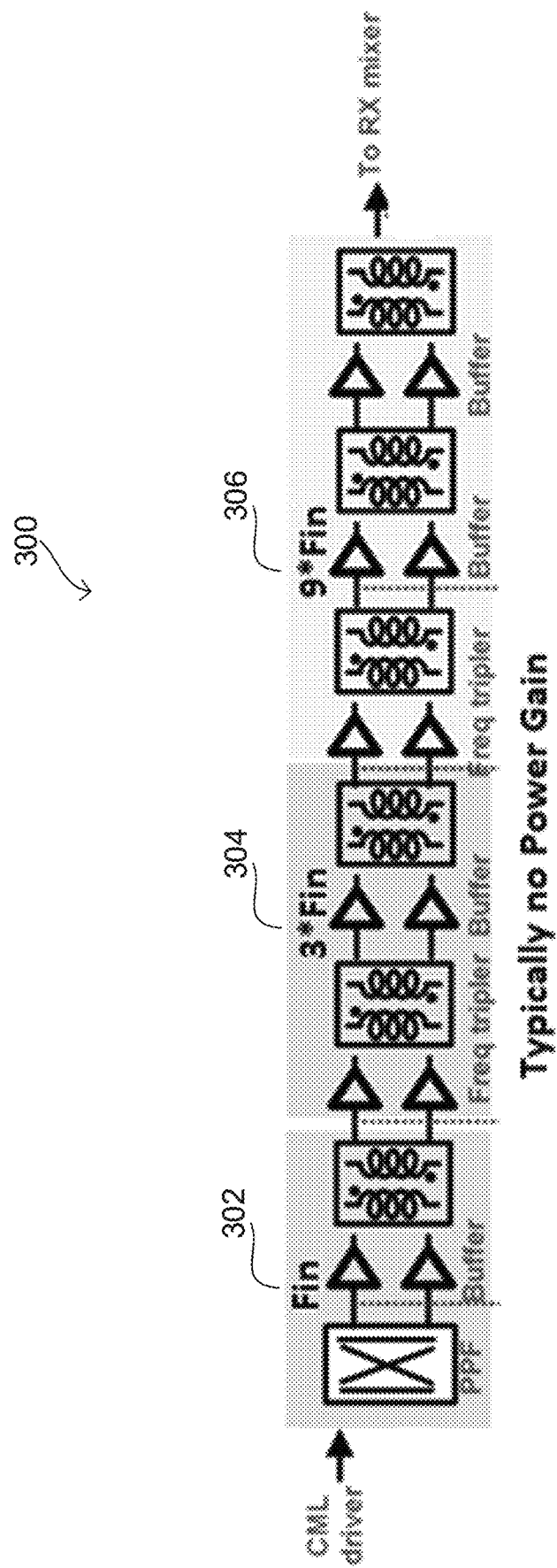
FIG. 3 shows an exemplary multi-stage tripler for LO multiplication.

FIG. 3 shows an exemplary multi-stage tripler 300 for LO multiplication. Multi-stage tripler 300 is configured to multiply the frequency of an input signal 302 by 9. Multi-stage tripler 300 includes architecture, as shown in FIG. 3, which occupies a significant die area without providing any power gain. Multi-stage tripler 300 includes a first stage 304 and second stage 306. First stage 304 multiplies input signal 302 by three and forwards the result to second stage 306. Second stage 306 multiplies the result of first stage 304 by three to generate an output signal frequency which is nine times greater than the frequency of input signal 302. The architecture of tripler 300 may include multiple matching networks and polyphaser filters that occupy an especially large die area when configure for low frequencies. Moreover, this architecture is not re-usable. For instance, the matching network and hence the whole system has to be re-designed if the mixer load changes even if the desired multiplier factor remains unchanged.

Figure 4:
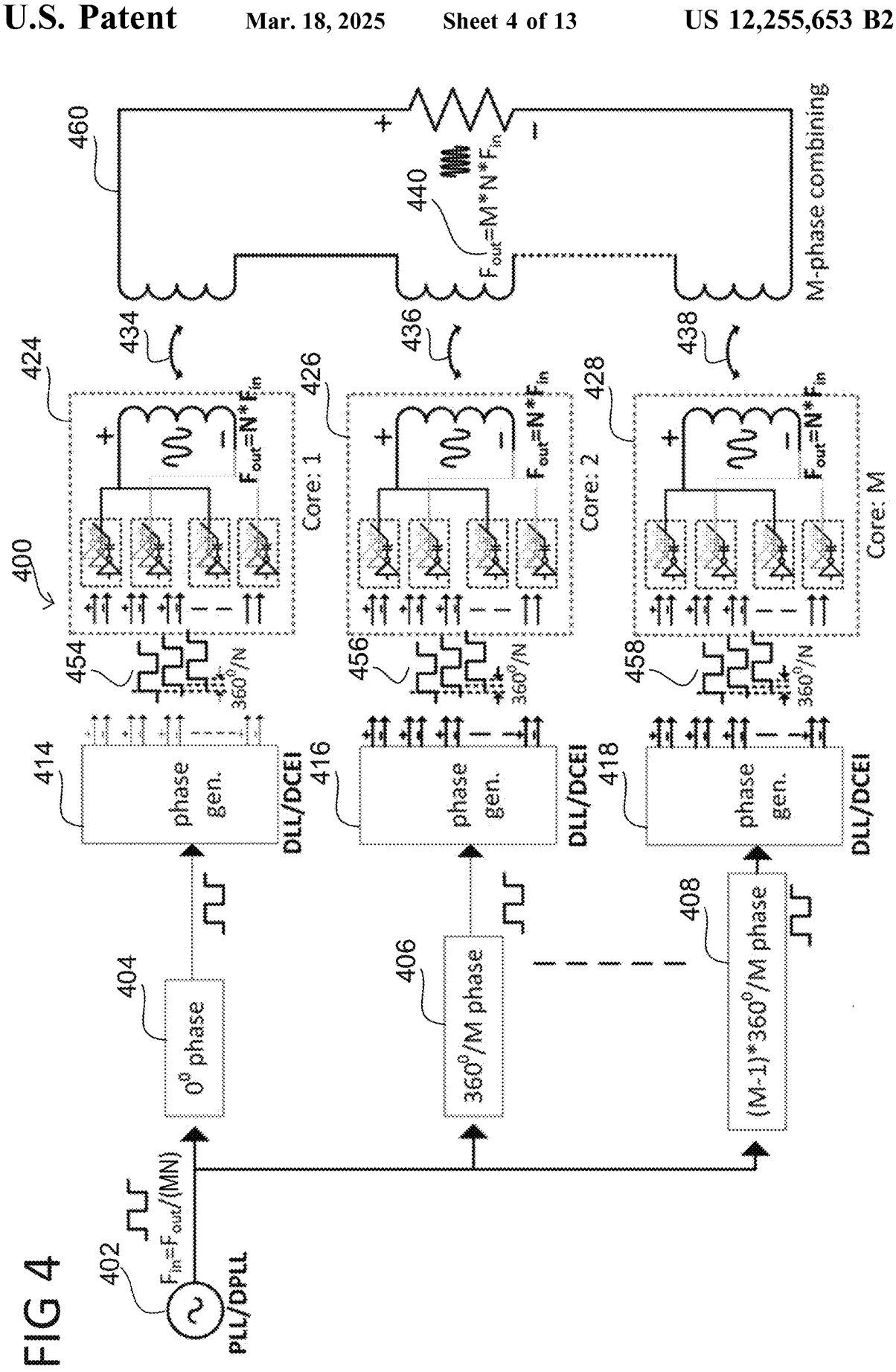
FIG. 4 shows an exemplary low frequency LO multiplication system including a DCM.

FIG. 4 shows an exemplary low frequency LO multiplication system 400 including a DCM. LO multiplication system may include phase generator 402, phase generators 414, 416, and 418, and PA cores 424, 426, and 428. Phase generator 402 may be a common phase locked loop (PLL) or a DPLL. Phase generator 402 may receive a low frequency input signal and generate multiple phases based on the frequency of the input signal and the desired frequency of the output signal. For example, phase generator 402 may generate three phases 404, 406, and 408 of the input signal. Each phase 404, 406, and 408 is distributed to phase generators 414, 416, and 418 respectively.

Phase generators 414, 416, and 418 generate sets of phases 454, 456, and 458 based on input phases 404, 406, and 408, respectively. Phase sets 454, 456, and 458 may each comprise multiple phases evenly distributed over a clock period. Phase sets 454, 456, and 458 are distributed to cores of power amplifiers 424, 426, and 428 respectively. The number of phases in the sets 454, 456, and 458 is based on the frequency of the input phases and a desired output frequency. Phase generators 414, 416, and 418 may be DLLs or DCEIs as previously noted. For example, a DLL generating phase-shifted signals separated by a phase that is a function of the number of unit cells to enable. Thus, the unit-phase granularity associated with an amount of phase-shift between the set of phase-shifted signals provided by the DLL is increased with the number of enabled unit cells.

PA cores 424, 426, and 428 may include compact inverter cells. Moreover, the multiplication factor and gain can be configured digitally to adapt to different system requirements. The unit cells may be disabled or enabled based on the phases from phase generators 414, 416, and 418 to generate output signals 434, 436, and 438, respectively. Output signals 434, 436, and 438, may then be combined to generate at an output signal 440 at the desired output signal.

The maximum frequency multiplication can be defined by a maximum number of phases of phase generator 402 and the number of unit cells in PA cores 424, 426, and 428. For example, if phase generator 402 may generate a maximum of three phases and each PA core 424, 426, and 428 includes eight unit cells, the maximum frequency of the output signal can be twenty-four (3*8) times greater than the frequency of the frequency of the input signal.

The distribution of phases from phase generator 402 and LO multipliers 414, 416, and 418 are at RF frequencies. The voltage-controlled oscillator (VCO)/digitally controlled oscillator (DCO) in phase generator 402 can be designed for optimum phase-noise without gathering extra penalty in Q degradation for mm-wave operation. The dividers in phase generator 402 feedback can be CMOS-based instead of CML or injection-locked. Both of these designs save power in phase generator 402. The RF LO distribution network also saves power compared to mm-wave LO distribution.

Multiple cores 424, 426, and 428 can leverage image rejection or spur suppression. The cores 424, 426, and 428 can be configured to generate outputs for combining into an output signal, wherein the frequency of the output signal is any multiple of the input frequency. For example, even, odd, or even fractional multiples of the input frequency.

Phase generators 414, 416, and 418 may be DCEIs for phase offset generation. The generated phase offsets are static and do not require a digital to clock converter (DTC). This configuration is useful when functioning as a frequency multiplier.

As an example, phase generator 402 may be a PLL with a center frequency of 4 GHz and can be varied from 3 GHz~5 GHz. Assuming the desired mmWave output frequency is 120 GHz. This may be accomplished with a three phase combining. M=3 wherein M is the number of phases. From this information, a control circuit can determine the required number of enabled unit cell power amplifiers N per PA core.

$$N=(F_{OUT}/F_{IN})/M$$

Where $F_{OUT}$ is the desired output frequency, $F_{IN}$ is the center frequency of the phase generator, and M is the number phases generated.

Therefore, N can be calculated as N=10 (N=(120/4)/3). Each LO multiplier receives a 120 deg. phase shifted LO at $F_{IN}$=4 GHz.

As shown in FIG. 4, the architecture the phase generator 402 generates three 120° phase shifted LO clocks 404, 406, and 408. In this case M=3. The input can be a constant phase LO, for the case where the DCM is a multiplier, or modulated, for the case where the DCM is a polar PA. Each of the three phases 404, 406, and 408 pass through phase generators 414, 416, or 418 (DLL or DCEI) block which may generate 20 phases phased apart at every 18°. This is especially true for differential implementation. The DLL/DCEI generated phases undergo through some minimum sized logic, followed by driver chain and unit multiplier cell. The phase offset ensures only one current path exists from P-channel metal-oxide-semiconductor (PMOS) through load to N-channel metal-oxide-semiconductor (NMOS) for the time duration equivalent to 18° phase difference at 4 GHz. Eventually, the RF outputs 434, 436, and 438 of three cores 424, 426, and 428 are combined (series/parallel) in order to generate third-harmonic output of each of the core's output. The impedance presented through the combiner 460 determines the overall output power.

Phase generators 414, 416, and 418 may be DCEIs for phase offset generation. This configuration is useful when functioning as a polar digital power amplifier for beamforming. For example, each core 424, 426, and 428 may be connected to an antenna element of an antenna array. A beam controller may enable and disable unit cells of cores 424, 426, and 428 based on phase sets 454, 456, and 458, respectively, to generate outputs 434, 436, and 438. Combiner 460 may combine outputs 434, 436, and 438 to generate a beam form comprising a desired frequency output associated with a main beam.

Figure 5:
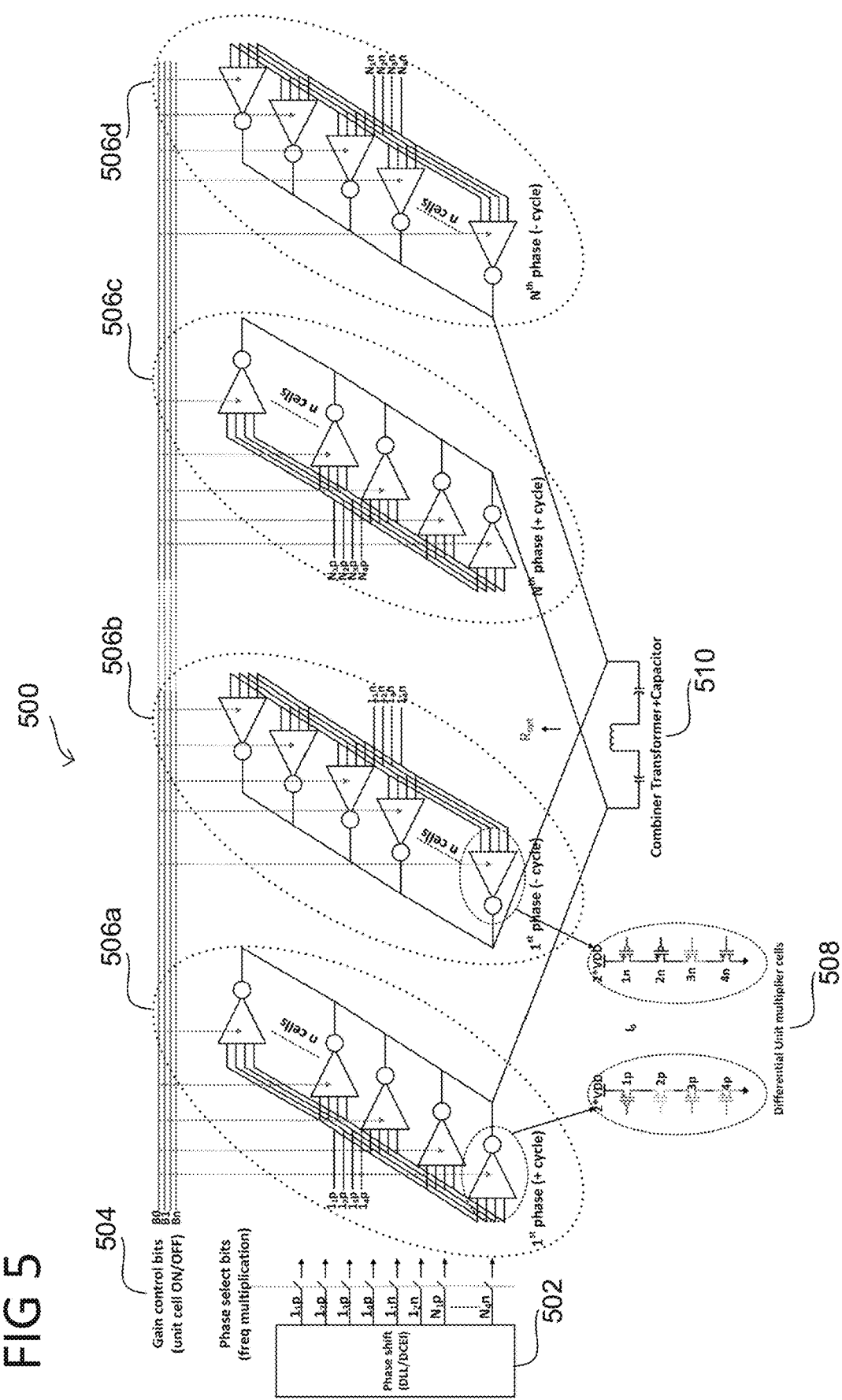
FIG. 5 shows an exemplary block diagram of a row (core) of power amplifiers.

FIG. 5 shows an exemplary block diagram of a row (core) 500 of power amplifiers unit cells. Core 500 may represent the configuration of cores 424, 426, or 428. Core 500 shows a configuration as a LO multiplier or a polar digital power amplifier as previously described.

Gain control is achieved by controlling how many unit cells are active in core 500 within the same phase path. Phase generator 502 may generate gain control bits 504 to determine which unit cell to enable/disable. Unit multiplier cells 506a-d are cascade switched-capacitor PA cells with tri-state capability. Multiplier cells 506a-d may generate output signals and core 500 may combine the output signals. The output signals may be later combined to generate a final output signal at a desired output frequency.

Figure 6:
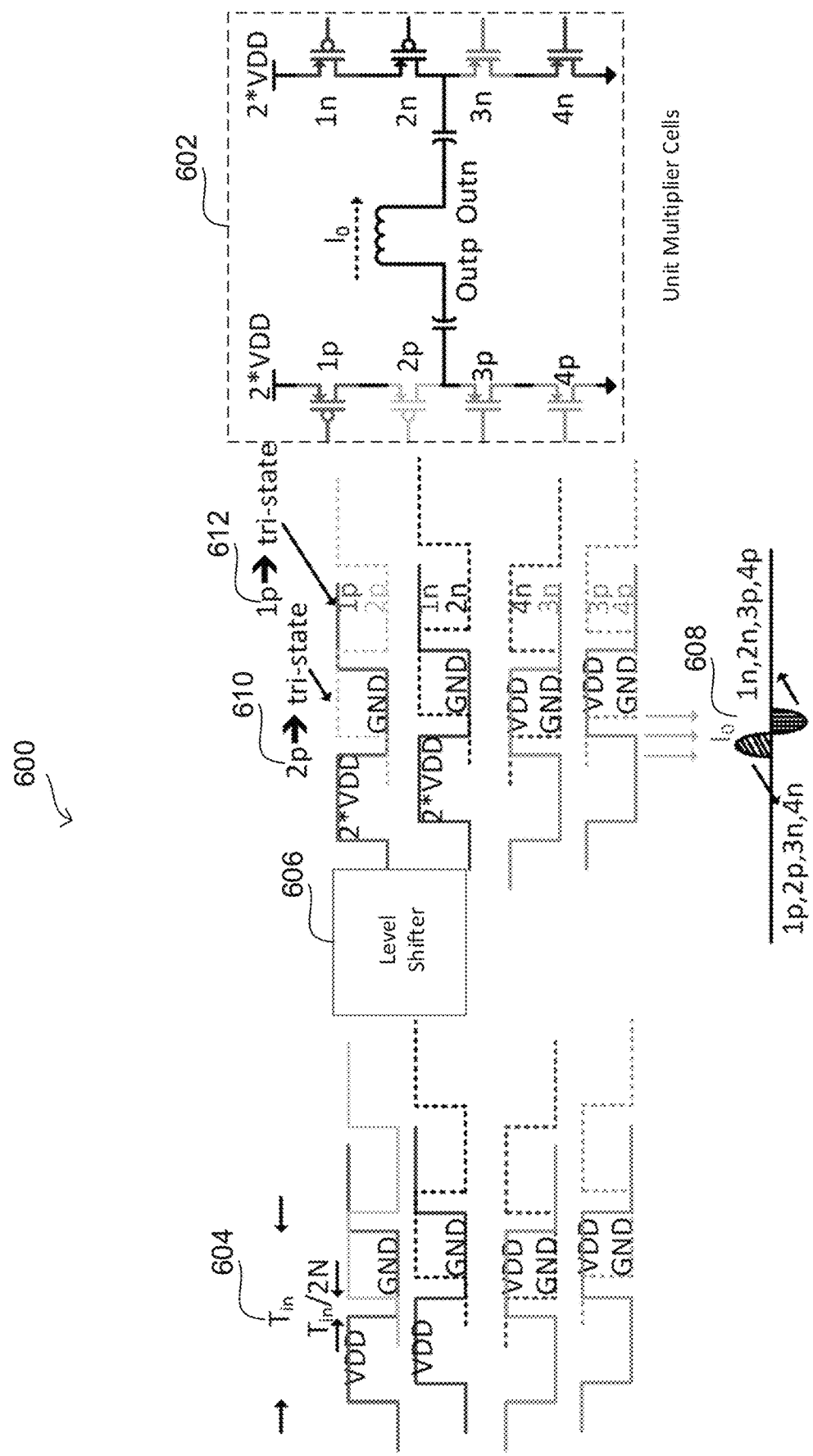
FIG. 6 shows an exemplary unit cell of a power amplifier.

FIG. 6 shows an exemplary unit multiplier cell 600 of a power amplifier. For example, multiplier cells 508 of power amplifiers 506a and 506b as shown in FIG. 5. Unit multiplier cells 602 may be configured for tri-stating to control whether or not it generates output. A tri-stating (PMOS and NMOS) PA allows shorting multiple unit cells which are driven by same phase LO clocks 610 and 612. Level shifter 606 ensures that no device exceeds the rated threshold voltage $V_{GS}$ at any condition. For example, even though the clocks are at 4 GHz, the current can flow only during ⅒th duration of the whole period through a pair of differential devices of unit cell 602, considering both positive and negative cycles 608 of current flow. For example, first positive phase 612 cannot flow through unit cell 602 while second positive phase 610 is flowing through unit cell 602. At other times, there is no current path through the same pair of differential devices due to tri-state mode of the devices. The unit cells may include driver chains with r:1 (r~3) fan-out ratio. The more stacked devices in a unit cell, the higher the frequency multiplication factor can be.

A cadence testbench has been simulated in 16FF complementary metal-oxide-semiconductor (CMOS) with real devices, driver chain, gain and phase control logic, using an expectation maximization (EM) model of the combiner, capacitor, and other component devices. The simulation was completed with a DLL LO multiplier using ideal Verilog model phase generation.

Figure 7:
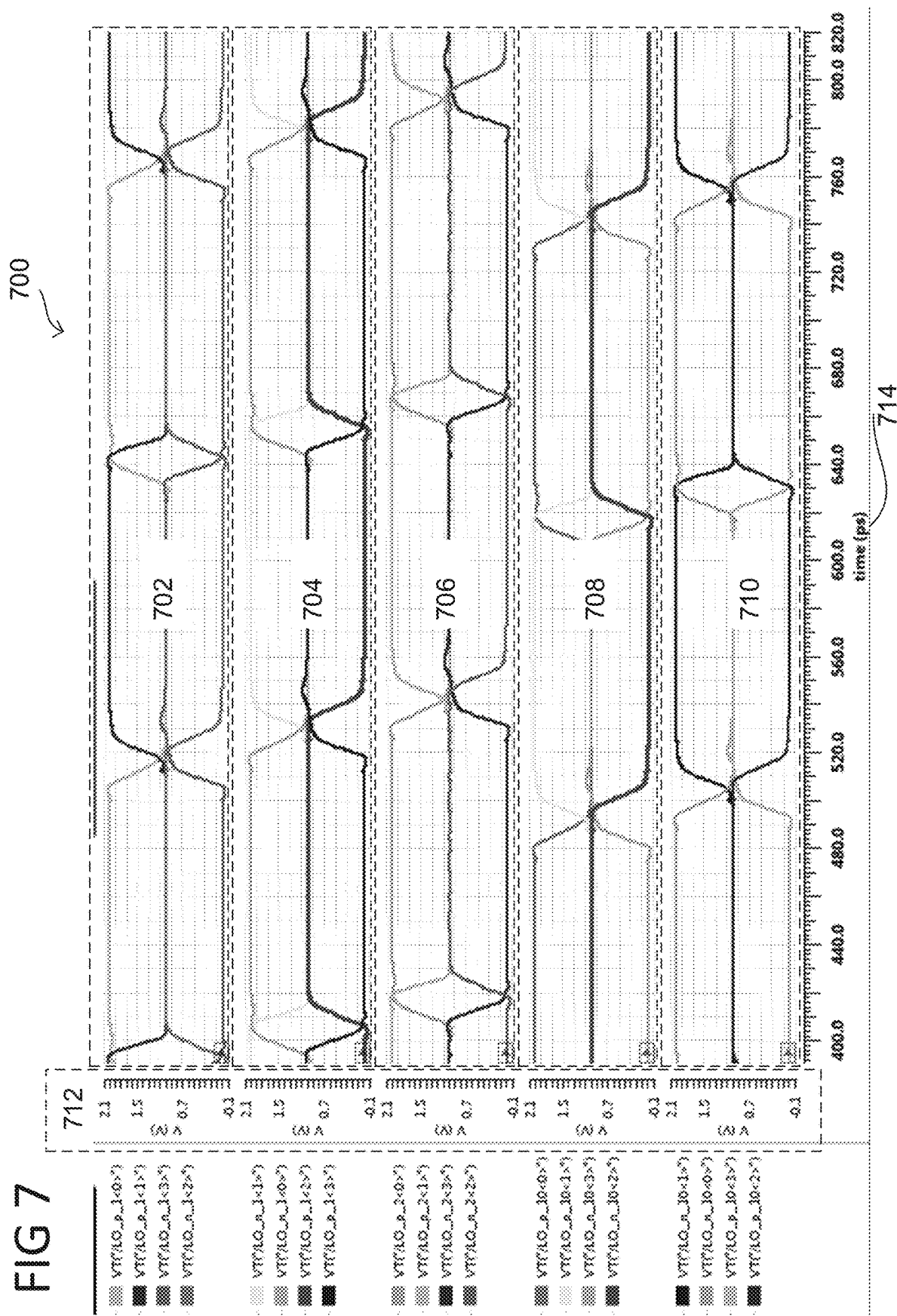
FIG. 7 shows exemplary gate signals for unit cells of a row of power amplifiers.

FIG. 7 shows exemplary chart 700 of simulation sets of gate signals 702, 704, 706, 708, and 710 for unit cells of a row of power amplifiers over time 714. Each set of gate signals 702, 704, 706, 708, and 710 may span a voltage range 712 of −0.1-2.1 volts. The sets of clock signals 702, 704, 706, 708, and 710 flow through the pair of component devices every 18°. For better visibility, only phases 1, 2, 3, 9 and 10 are shown. Where the set of signals 702 represents phase 1, set of signals 704 represents phase 2, set of signals 706 represents phase 3, set of signals 708 represents phase 9, and set of signals 710 represents phase 10. The sets of gate signals 702, 704, 706, 708, and 710 for a PMOS level shifter have been shifted in order to maintain maximum 1V voltage stress on the devices.

Figure 8:
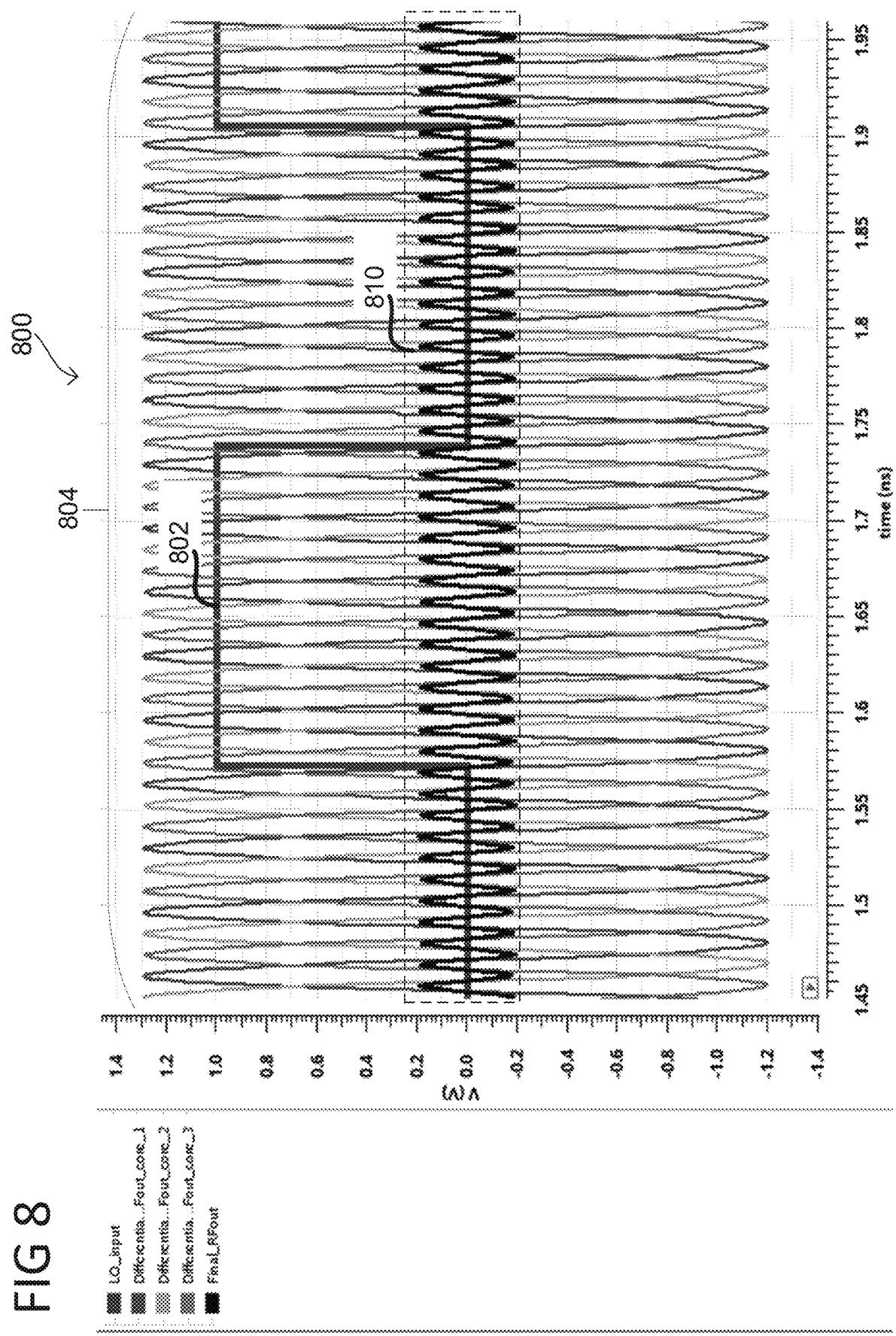
FIG. 8 shows exemplary combination to generate a high frequency output signal.

FIG. 8 shows a chart 800 exemplary RF waveshapes to generate a high frequency output signal 810. The chart 800 represents the waveforms of the simulation of FIG. 7. The simulation shows frequency multiplication of low frequency input clock 802. The simulation was conducted with three PA cores. Each core generates a high frequency RF output signal 804. Every third peak of waveforms 804 represents a PA core output. The waveforms 804 can be combined to generate a high frequency mmWave 810.

Figure 9:
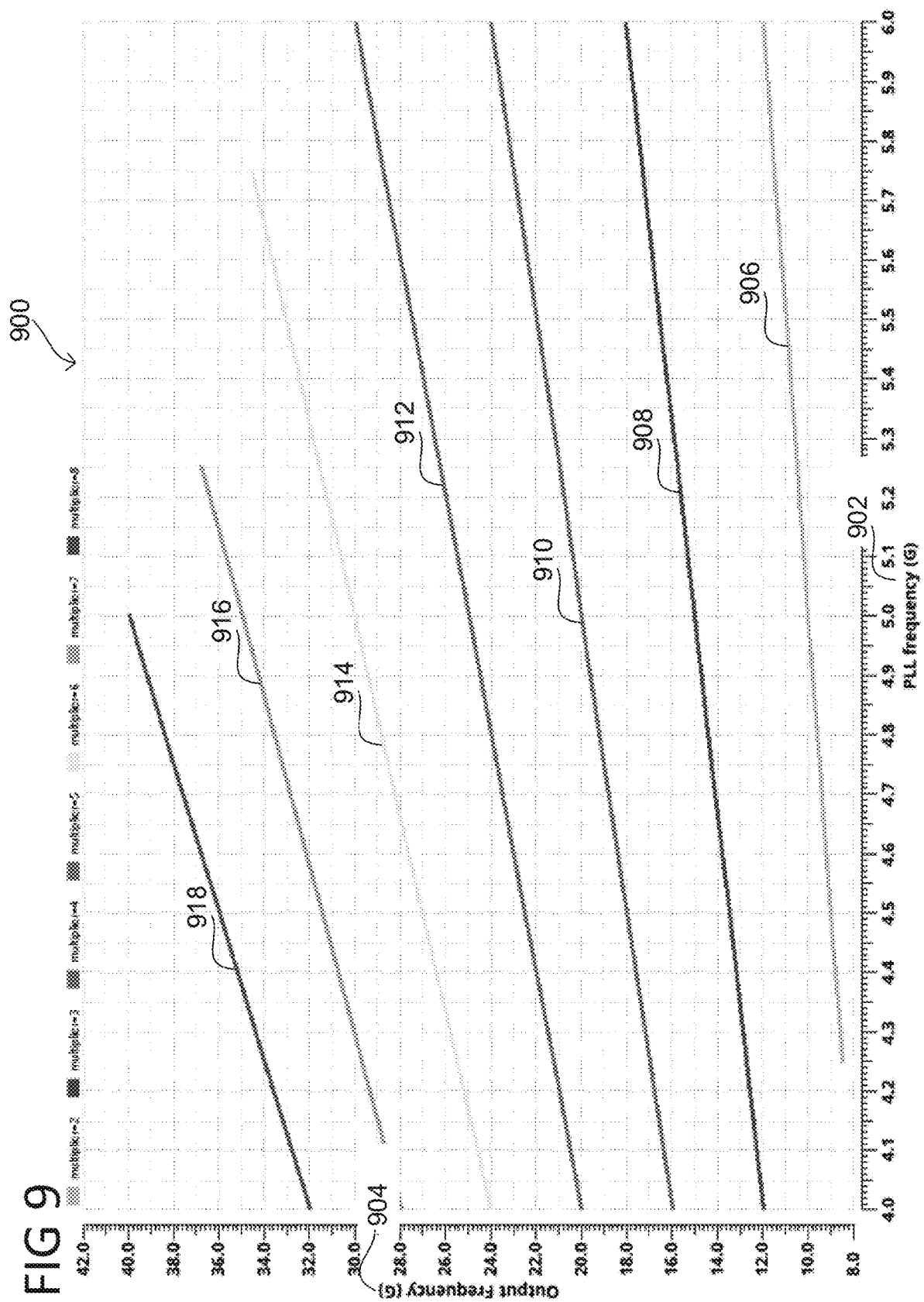
FIG. 9 shows exemplary effects of different multiplication factors.

FIG. 9 shows exemplary chart 900 of effects of different multiplication factors and VCO turning range. Each line 906, 908, 910, 912, 914, 916, and 918 shows the input frequency 902 along the horizontal axis vs the output frequency 904 along the vertical axis for different multiplication factors. Lines 906, 908, 910, 912, 914, 916, and 918 represent multiplication factors of 2, 3, 4, 5, 6, 7, and 8, respectively.

For the simulation represented by FIGS. 7-9, the digital configuration bits have been changed from zero to full range to validate the frequency tuning range. In this simulation, it is assumed that the PLL has a frequency tuning capacity of 2G which corresponds to approximately 25% fractional bandwidth. It is evident from FIG. 9 that output frequency can be tuned anywhere from 9 GHz to 40 GHz, for multiplication factor of 2 and 10, respectively. High multiplication factors may cause undesired effects such as poor phase noise, jitter, and crowbar current. Also, extremely shallower pulse may cause a timing issue which would also cause undesired harmonic spurs. Spurs can be problematic in an analog Tx/Rx chain due to the intermodulation.

Figure 10:
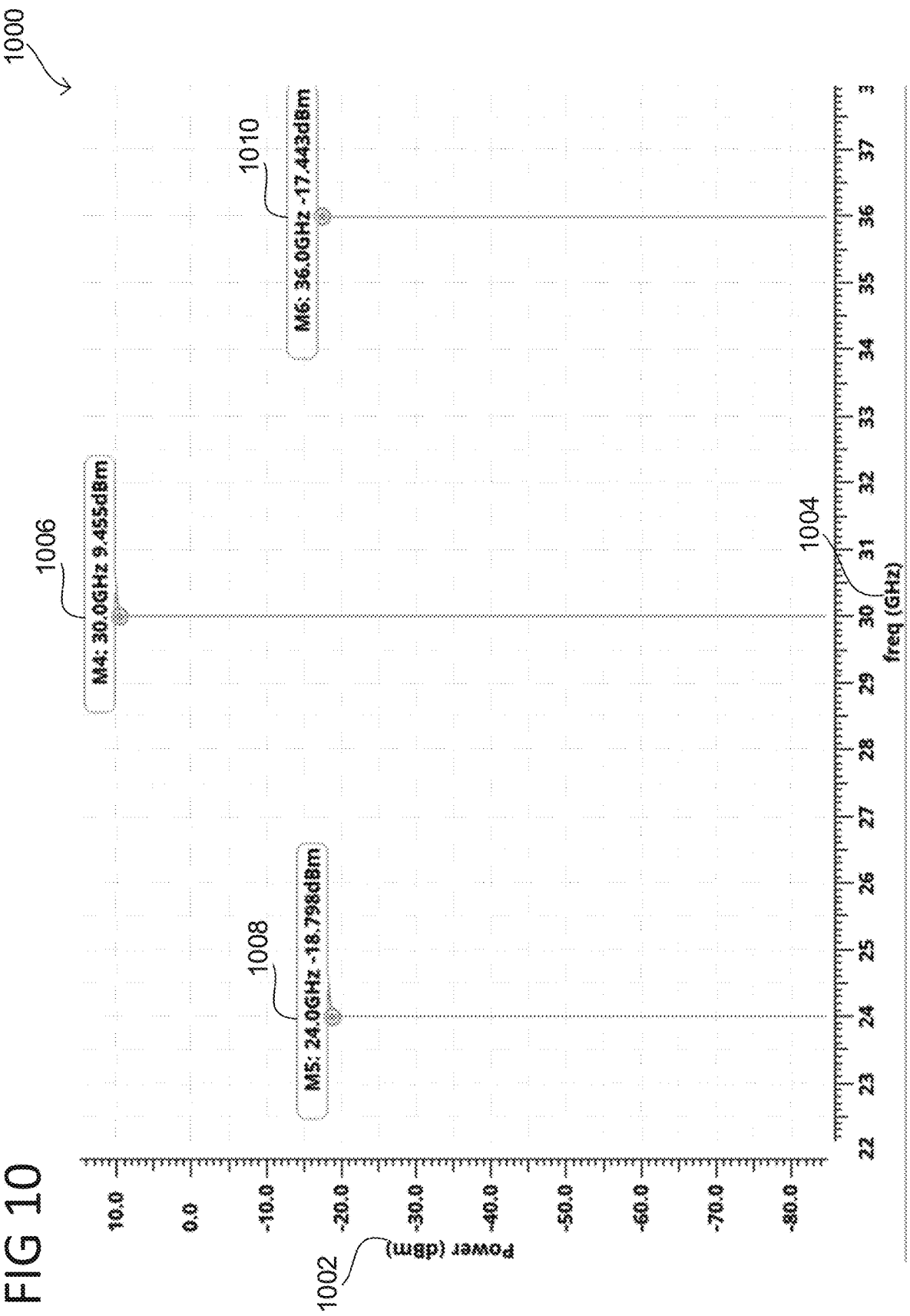
FIG. 10 shows exemplary output of multiple rows of power amplifiers in a DCM.

FIG. 10 shows a chart 1000 of the power levels 1002 of the fundamental output of the simulation of several PA cores 1006, 1008, and 1010 at harmonics 1004 of input frequency. Chart 1000 shows that approximately 9.5 dBm of output power 1006. Approximately 26 dBc of suppression is achieved for this PA core. Proper optimization or a harmonic trap may be used at the combiner final combiner to suppress the harmonics even further.

Figure 11:
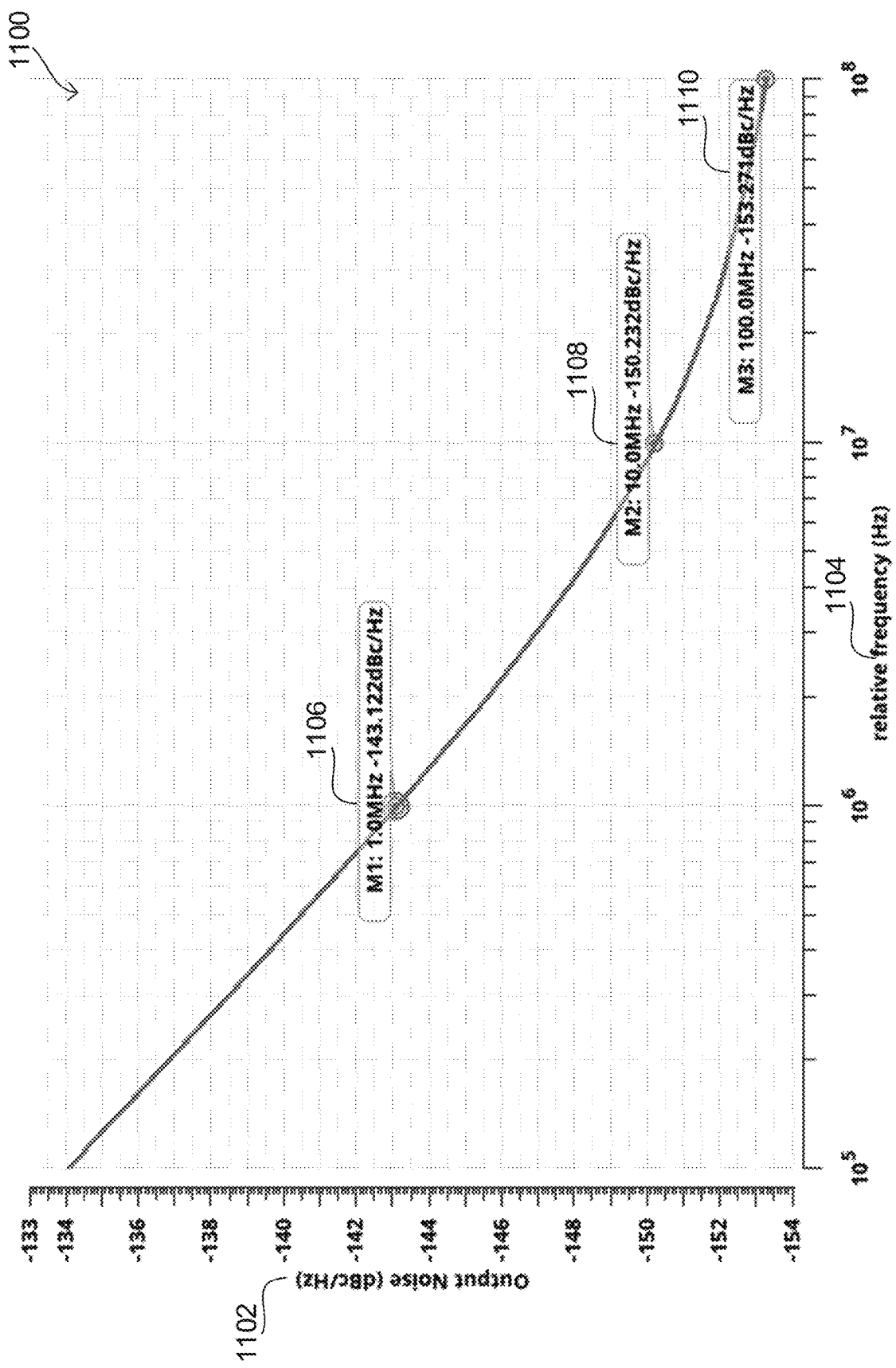
FIG. 11 shows an exemplary chart of phase noise of a high frequency output signal.

FIG. 11 shows an exemplary chart 1100 of phase noise 1102 of a high frequency 1104 output signal. Phase noise 1102 is closely related to efficiency. A high drive strength buffer chain would reduce the efficiency but improve phase noise and jitter. Chart 1100 shows the phase noise 1102 for different PA cores 1106, 1108, and 1110. Chart 1100 shows −150 dBc/Hz for core 1110 and −153 dBc/Hz for core 1108 for 10 MHz and 10 MHz offset, respectively.

Figure 12:
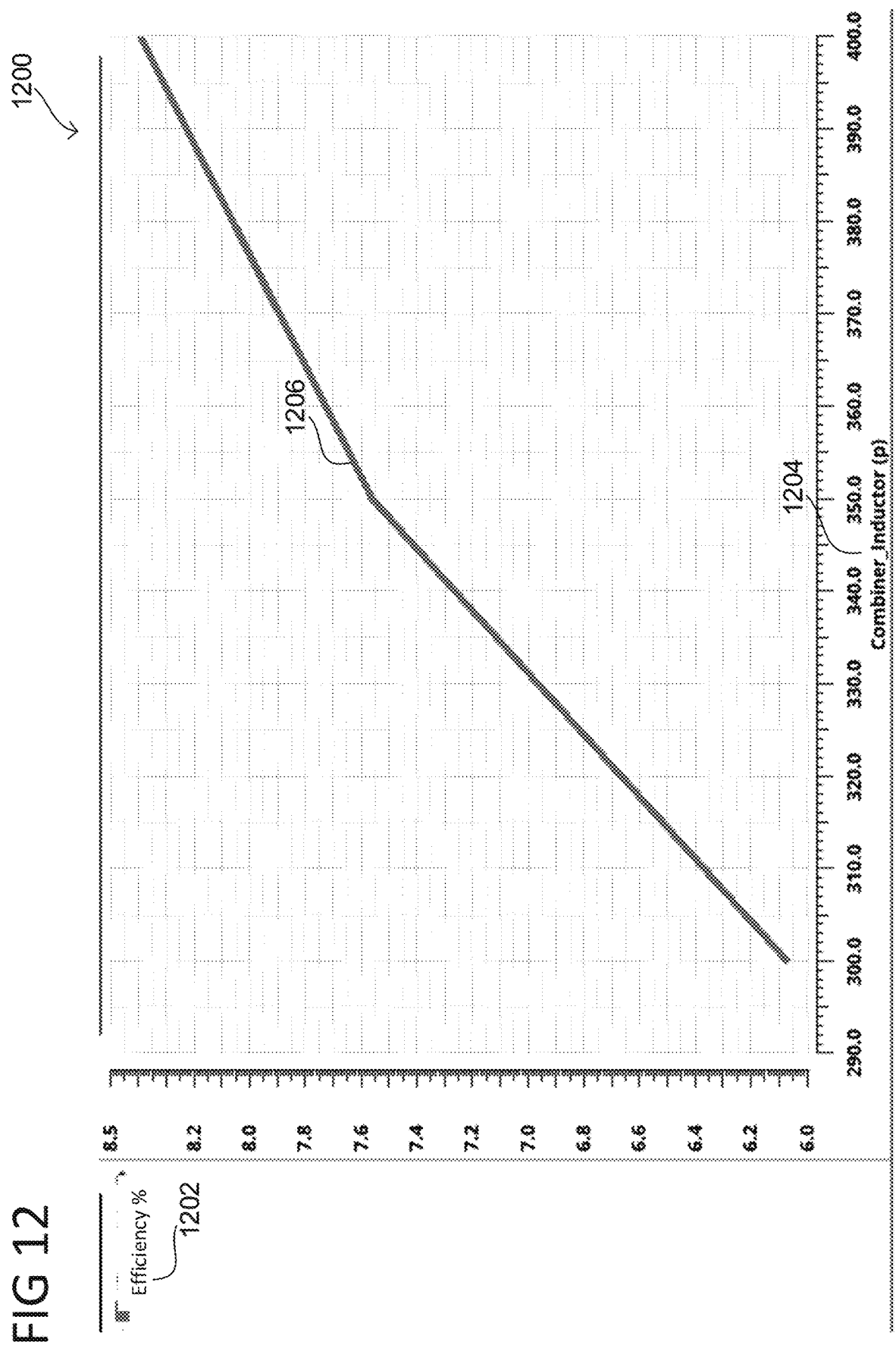
FIG. 12 shows an exemplary chart of efficiency of a DCM system.

FIG. 12 shows an exemplary chart 1200 of efficiency of a DCM system simulation. Chart 1200 shows efficiency 1202 as a function 1206 of inductance 1204 of a signal combiner. Chart 1200 shows efficiency of 8.5% (not considering phase generation). It is worthwhile to mention that most conventional LO multipliers do not offer any power gain at all. Therefore, overall efficiency is extremely poor. Chart 1200 represents an efficiency (%) @ 30 GHz for Pout=9.5 dBm (per PA core).

FIG. 13 shows a method 1300 for generating a high frequency output signal. FIG. 13 shows exemplary method 1300. As shown in FIG. 13, method 1300 includes receiving a phase shift of a driving clock phase (stage 1302); disabling one or more of a plurality of switched capacitor power amplifier unit cells of a row of power amplifiers based on a frequency of the phase shift (stage 1304); generating an output signal for each of the switched capacitor power amplifier unit cells (stage 1306); and combining the output signal for each of the power amplifier unit cells to generate a power amplifier row output signal (stage 1308).

For frequency multiplication, a re-configurable DCM which may be configured for multiple multiplication factors. This offers gain and phase control mechanisms in conjunction with frequency control. This reconfigurable DCM may also function as a direct digital polar up-converting PA. While the architecture may be configured in multiple ways, stacking 3 cascade devices would give additional multiplication. However, stacking 3-devices when the re-configurable DCM is configured as a digital polar PA may introduce errors due to Ron resistance. When re-configurable DCM is configured as a low frequency clock multiplier it can easily stacking M-cascode devices to achieve extremely high frequency clock output.

While the above descriptions and connected figures may depict electronic device components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc.

It is appreciated that implementations of methods detailed herein are demonstrative in nature and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

The following examples disclose various aspects of this disclosure:

In Example 1, a digital clock multiplier (DCM) circuit including: a plurality of power amplifier (PA) rows, wherein each PA row comprises a plurality of cascade switched capacitor power amplifiers (SCPA) unit cells configured to: receive a phase shift of a driving clock phase; and one or more processors configured to: disable of one or more of the plurality of cascade SCPA unit cells based on a frequency of the phase shift; generate an output signal for each of the cascade SCPA unit cells; and combine the output signal for each of the cascade SCPA unit cells to generate an PA row output signal.

In Example 2, the subject matter of Example 1, may optionally further include a phase generator configured to generate a plurality of driving clock phases, wherein the driving clock phase is one of the plurality of driving clock phases.

In Example 3, the subject matter of Examples 1 or 2, may optionally further include wherein the phase generator is a phase locked loop (PLL).

In Example 4, the subject matter of Examples 1 to 3, may optionally further include wherein the phase generator is a digital phase locked loop (DPLL).

In Example 5, the subject matter of Examples 1 to 4, may optionally further include a plurality of phase shift generators configured to receive the driving clock phase; and generate a plurality of phase shifts of the driving clock phase, wherein each of the plurality of phase shift generators is coupled to one of the plurality PA rows.

In Example 6, the subject matter of Examples 1 to 5, may optionally further include wherein in the plurality of phase shift generators are delay lock loops (DLLs).

In Example 7, the subject matter of Examples 1 to 6, may optionally further include a mixer, wherein in the DCM is further configured to: combine the PA row output signals for each of the plurality of PA rows to generate a high frequency output signal; and drive the mixer based on the high frequency output signal.

In Example 8, the subject matter of Examples 1 to 7, may optionally further include wherein in the plurality of phase shift generators are digitally controlled edge-interpolators (DCEIs).

In Example 9, the subject matter of Examples 1 to 8, may optionally further include an antenna, wherein in the DCM is further configured to: combine the PA row output signals for each of the plurality of PA rows to generate a power amplified high frequency output signal; and forward the power amplified high frequency output signal to the antenna.

In Example 10, the subject matter of Examples 1 to 9, may optionally further include wherein the antenna is an antenna array.

In Example 11, the subject matter of Examples 1 to 10, may optionally further include wherein the plurality of cascade SCPA unit cells are configured for a high impedance state.

In Example 12, the subject matter of Examples 1 to 11, may optionally further include wherein, the SCPA unit cells comprise a tri-state buffer, wherein the tri-state buffer determines the phase shift from a plurality of phase shifts to drive the SCPA unit cell.

In Example 13, the subject matter of Examples 1 to 12, may optionally further include wherein the high impedance state of the SCPA unit cells disables the SCPA unit cell.

In Example 14, a method including receiving a phase shift of a driving clock phase; disabling one or more of a plurality of cascade SCPA unit cells of a row of PAs based on a frequency of the phase shift; generating an output signal for each of the cascade SCPA unit cells; and combining the output signal for each of the cascade SCPA unit cells to generate an PA row output signal.

In Example 15, the subject matter of Example 14, may optionally further include comprising generating a plurality of driving clock phases, wherein the driving clock phase is one of the plurality of driving clock phases.

In Example 16, the subject matter of Examples 14 or 15, may optionally further include receiving one of the plurality of driving clock phases; and generating the phase shift of the driving clock phase.

In Example 17, the subject matter of Examples 14 to 16, may optionally further include combining the PA row output signals for each of a plurality of PA rows to generate a high frequency output signal; and driving a mixer based on the high frequency output signal.

In Example 18, the subject matter of Examples 14 to 17, may optionally further include combining the PA row output signals for each of a plurality of PA rows to generate a power amplified high frequency output signal; and forwarding the power amplified high frequency output signal to an antenna.

In Example 19, the subject matter of Examples 14 to 18, may optionally further include enabling a high impedance state for one or more of the plurality of cascade SCPA unit cells.

In Example 20, the subject matter of Examples 14 to 19, may optionally further include wherein the high impedance state of the SCPA unit cells disables the SCPA unit cell.

In Example 21, one or more non-transitory computer readable media including programmable instructions thereon, that when executed by one or more processors of a device, cause the device to perform any one of the methods of claims 14 to 20.

In Example 22, a system including one or more devices according to any of claims 1 to 13, the system configured to implement a method according to any of claims 14 to 20.

In Example 23, a means for implementing any of the claims 1 to 13.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A digital clock multiplier (DCM) circuit comprising:
a plurality of phase shift generators, each configured to:
 receive a respective driving clock phase of a plurality of driving clock phases; and
 generate a plurality of phase shifts based on the respective driving clock phase, wherein in the plurality of phase shift generators are delay lock loops (DLLs) or digitally controlled edge-interpolators (DCEIs);
a plurality of power amplifier (PA) rows, wherein each of the plurality of phase shift generators is coupled to a respective one of the plurality of PA rows,
wherein each PA row comprises a plurality of cascade switched capacitor power amplifier (SCPA) unit cells arranged into groups, each group of cascade SCPA unit cells configured to:
 receive one phase shift of the plurality of phase shifts based on the respective driving clock phase; and
one or more processors configured to:
 disable one or more cascade SCPA unit cells of each group based on the plurality of phase shifts;
 generate an output signal for each group of the plurality of cascade SCPA unit cells; and
 combine the output signal of each group of the plurality of cascade SCPA unit cells to generate a PA row output signal.

2. The DCM circuit of claim 1, further comprising a phase generator configured to generate the plurality of driving clock phases for a driving clock frequency.

3. The DCM circuit of claim 2, wherein the phase generator is a phase locked loop (PLL).

4. The DCM circuit of claim 2, wherein the phase generator is a digital phase locked loop (DPLL).

5. The DCM circuit of claim 2, further comprising a combiner configured to combine the PA row output signal of each of the plurality of PA rows to generate an output signal, wherein the plurality of phase shift generators comprises M phase shift generators, where M is an integer greater than 2, and the plurality of phase shifts comprises N phase shifts, where N is an integer greater than 1, wherein the PA row output signal has a frequency that is N times the driving clock frequency, and wherein the output signal has a frequency that is M times N times the driving clock frequency.

6. The DCM circuit of claim 1, wherein the plurality of phase shift generators are delay lock loops (DLLs), wherein the DCM circuit further comprises a mixer, and wherein the DCM is further configured to:
combine the PA row output signals of each of the plurality of PA rows to generate a high frequency output signal; and
drive the mixer based on the high frequency output signal.

7. The DCM circuit of claim 1, wherein the plurality of phase shift generators are digitally controlled edge-interpolators (DCEIs), wherein the DCM circuit further comprises an antenna, and wherein the DCM is further configured to:
combine the PA row output signals of each of the plurality of PA rows to generate a power amplified high frequency output signal; and
forward the power amplified high frequency output signal to the antenna.

8. The DCM circuit of claim 7, wherein the antenna is an antenna array.

9. The DCM circuit of claim 1, wherein the plurality of cascade SCPA unit cells are configured for a high impedance state.

10. The DCM circuit of claim 9, wherein the SCPA unit cells comprise a tri-state buffer, wherein the tri-state buffer determines the one phase shift from the plurality of phase shifts to drive the SCPA unit cell.

11. The DCM circuit of claim 10, wherein the high impedance state of the SCPA unit cells disables the SCPA unit cell.

12. The DCM circuit of claim 1, wherein the driving clock frequency is a low frequency input clock and the high frequency output signal is a high frequency output clock, wherein the high frequency output clock is a multiple of the low frequency input clock.

13. The DCM circuit of claim 1, wherein the groups comprises a set of cascade SCPA unit cells for each phase of the plurality of phase shifts.

14. The DCM circuit of claim 13, wherein the groups are differential and each set of cascade SCPA unit cells for a respective phase includes a subset of cascade SCPA unit cells configured to receive a positive cycle of the respective phase as input and another subset of cascade SCPA unit cells configured to receive a negative cycle of the respective phase as input.

15. A method comprising:
receiving, by each of a plurality of phase shift generators, a respective driving clock phase of a plurality of driving clock phases;
generating, by each of the plurality of phase shift generators, a plurality of phase shifts based on the respective driving clock phase, wherein in the plurality of phase shift generators are delay lock loops (DLLs) or digitally controlled edge-interpolators (DCEIs);
receiving, by each group of cascade switched capacitor power amplifier (SCPA) unit cells of a power amplifier (PA) row, one phase shift of the plurality of phase shifts based on the respective driving clock phase;
disabling, by each group of cascade SCPA unit cells, one or more cascade SCPA unit cells based on the plurality of phase shifts;
generating an output signal for each group of cascade SCPA unit cells; and
combining the output signal of each group of cascade SCPA unit cells to generate a PA row output signal.

16. The method of claim 15, further comprising generating the plurality of driving clock phases for a driving clock frequency.

17. The method of claim 16, further comprising:
combining the PA row output signals for each of a plurality of PA rows to generate a high frequency output signal; and
driving a mixer based on the high frequency output signal.

18. The method of claim 16, further comprising:
combining the PA row output signals for each of a plurality of PA rows to generate a power amplified high frequency output signal; and
forwarding the power amplified high frequency output signal to an antenna.

19. The method of claim 15, further comprising enabling a high impedance state for one or more of the plurality of cascade SCPA unit cells.

20. The method of claim 19, wherein the high impedance state of the SCPA unit cells disables the SCPA unit cell.

* * * * *